United States Patent
Matsuda et al.

[11] Patent Number: 6,141,812
[45] Date of Patent: Nov. 7, 2000

[54] CLEANING APPARATUS AND CLEANING MEMBER RINSING APPARATUS

[75] Inventors: Naoki Matsuda; Kenya Ito, both of Kanagawa-ken, Japan

[73] Assignee: Ebara Corporation, Tokyo, Japan

[21] Appl. No.: 09/189,985

[22] Filed: Nov. 12, 1998

[30] Foreign Application Priority Data

Nov. 13, 1997 [JP] Japan .................................. 9-330993

[51] Int. Cl.[7] ................................................. B08B 3/04
[52] U.S. Cl. ........................... 15/102; 15/77; 15/88.2; 134/104.1; 134/135; 134/155
[58] Field of Search ............................ 134/135, 155, 134/104.1; 15/77, 88.2, 97.1, 102, 21.1

[56] References Cited

U.S. PATENT DOCUMENTS

| | | | |
|---|---|---|---|
| 4,730,631 | 3/1988 | Schwartz | 134/155 |
| 5,186,194 | 2/1993 | Kitajima | 134/155 |
| 5,636,401 | 6/1997 | Yonemizu et al. | 15/97.1 |
| 5,685,039 | 11/1997 | Hamada et al. | 15/102 |
| 5,868,866 | 2/1999 | Maekawa et al. | 15/88.2 |

FOREIGN PATENT DOCUMENTS

| | | |
|---|---|---|
| 60-194335 | 12/1985 | Japan . |
| 2-109333 | 4/1990 | Japan . |
| 2-109335 | 4/1990 | Japan . |
| 3-53524 | 3/1991 | Japan . |

*Primary Examiner*—Robert J. Warden, Sr.
*Assistant Examiner*—Kaj K. Olsen
*Attorney, Agent, or Firm*—Wenderoth, Lind & Ponack, L.L.P.

[57] ABSTRACT

A rinsing apparatus comprising a rinsing sink for rinsing an article brought thereinto with a rinsing liquid which is continuously supplied thereinto, and a carrier for carrying an article to be rinsed. The rinsing sink is provided with a drain hole in the bottom wall of the sink. The carrier is adapted to move between a rinsing position where the article is positioned close to an inlet of the drain hole, thereby restricting a flow path from the sink to the drain hole so that the rinsing liquid continuously supplied into the sink fills and then overflows from the sink while a flow of the rinsing liquid through the restricted flow path is maintained, and a retracted position where the article is positioned out of the sink to allow the rinsing liquid to flow through the flow path into the drain hole without the restriction by the article.

10 Claims, 5 Drawing Sheets

CLEANING APPARATUS AND CLEANING MEMBER RINSING APPARATUS

BACKGROUND OF THE INVENTION

This invention relates to a cleaning apparatus for cleaning an article such as a semiconductor wafer which has been subjected to a polishing process and, in particular, to an apparatus for rinsing a cleaning member of such a cleaning apparatus.

In production of semiconductor devices, following a polishing process, a semiconductor wafer is subject to a cleaning process by a cleaning apparatus for removing slurry particles attached to the wafer during a polishing process. The cleaning apparatus includes a cleaning member such as a rotating sponge cleaning member or a rotating brush which is adapted to be engaged with a surface of a semiconductor wafer onto which water is being continuously supplied to remove slurry particles from the wafer surface. Accordingly, it is necessary for the cleaning member to be rinsed periodically to keep it in a good condition by removing slurry particles from the cleaning member, which particles are transferred from the wafer.

A typical rinsing apparatus of this type includes a sink in which a rinsing liquid or water is supplied and a cleaning member is rinsed in the supplied rinsing liquid. However, such a rinsing apparatus involves a problem that during rinsing operations, slurry particles removed from wafers are deposited on a bottom wall of the rinsing sink thus leading to a tendency for the rinsing liquid to become contaminated, and the cleaning member which is subject to the rinsing process in the rinsing liquid might consequently also become contaminated. It is therefore conventional for a rinsing liquid to be continuously supplied into a rinsing sink in such a manner that the rinsing liquid overflows from the sink and/or is drained through a drain hole provided in a wall of the rinsing sink. For instance, Japanese Laid-Open Patent Application Hei 3-53524 and Japanese Laid-Open Utility Model Application Sho 60-194335 disclose apparatuses for effecting such a rinsing operation.

However, it is difficult for such a rinsing apparatus to entirely avoid the depositing of slurry particles in a rinsing sink. In order to enhance the quality of a rinsing operation, it is therefore desirable to further improve such a rinsing apparatus to enable as many slurry particles as possible to be removed from a rinsing sink.

SUMMARY OF THE INVENTION

An object of the present invention is to provide such an improved rinsing apparatus.

According to the present invention, a rinsing apparatus includes a rinsing sink having a bottom wall and a side wall defining a cavity for rinsing an article such as a cleaning member of a cleaning apparatus brought into the cavity with a rinsing liquid which is continuously supplied thereinto, a drain for receiving the rinsing liquid which has overflowed from said rinsing sink into said drain, and a carrier for carrying an article to be rinsed. The rinsing sink is provided with a drain hole in its bottom wall. The carrier is adapted to move between a rinsing position, where the article is positioned close to an inlet of the drain hole provided in the bottom wall (thus restricting a flow path from the sink to the drain hole so that the rinsing liquid continuously supplied into the sink fills and then overflows from the sink while a flow of the rinsing liquid through the restricted flow path is maintained), and a retracted position where the article is positioned out of the sink so as to thereby allow the rinsing liquid to flow through the flow path into the drain hole without any restriction being caused by the article.

The drain hole may be sized such that, when the carrier is in the retracted position, all the rinsing liquid continuously supplied into the rinsing sink flows out from the sink through the drain hole in the bottom wall.

The present invention further provides a cleaning apparatus for cleaning an article such as a semiconductor wafer which has been subject to a polishing process. The cleaning apparatus is provided with a rinsing apparatus as noted above for rinsing a cleaning member of the cleaning apparatus.

Specifically, the cleaning apparatus comprises a cleaning station and a cleaning member rinsing station. The cleaning station includes a cleaning member adapted to be engaged with and moved relative to a surface of an object to be cleaned. The cleaning member rinsing station includes a rinsing sink for rinsing the cleaning member. The cleaning apparatus further includes a cleaning member carrier for carrying the cleaning member between a first position, where the cleaning member is engaged with the surface of the object to carry out a cleaning operation of the surface by means of the cleaning member, and a second position, where the cleaning member is positioned in the rinsing sink to carry out a rinsing operation of the cleaning member. The rinsing sink has a bottom wall and a side wall defining a cavity for rinsing the cleaning member which is brought into the cavity by way of a rinsing liquid which is continuously supplied thereinto. The rinsing sink is provided with a drain hole in the bottom wall. The carrier is adapted to move between a rinsing position where the cleaning member is positioned close to an inlet of the drain hole provided in the bottom wall (thus restricting a flow path from the sink to the drain hole so that the rinsing liquid continuously supplied into the sink fills and then overflows from the sink while a flow of the rinsing liquid through the restricted flow path is maintained), and a retracted position where the cleaning member is positioned out of the sink to allow the rinsing liquid to flow through the flow path into the drain hole without any restriction being caused by the cleaning member.

DETAILED DESCRIPTION OF THE INVENTION

Figure 1:
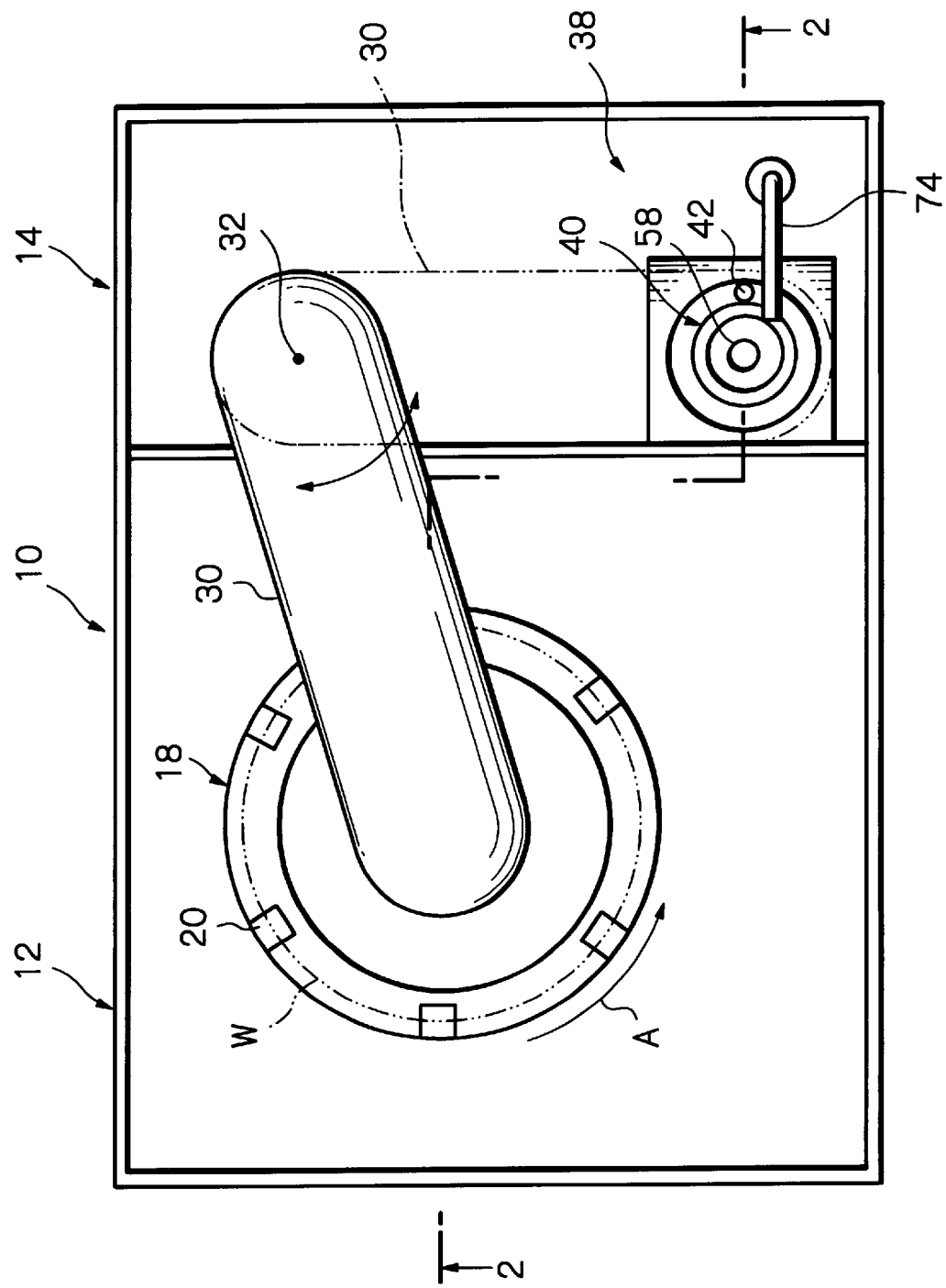
FIG. 1 is a plan view of a cleaning apparatus in accordance with the present invention.
Figure 2:
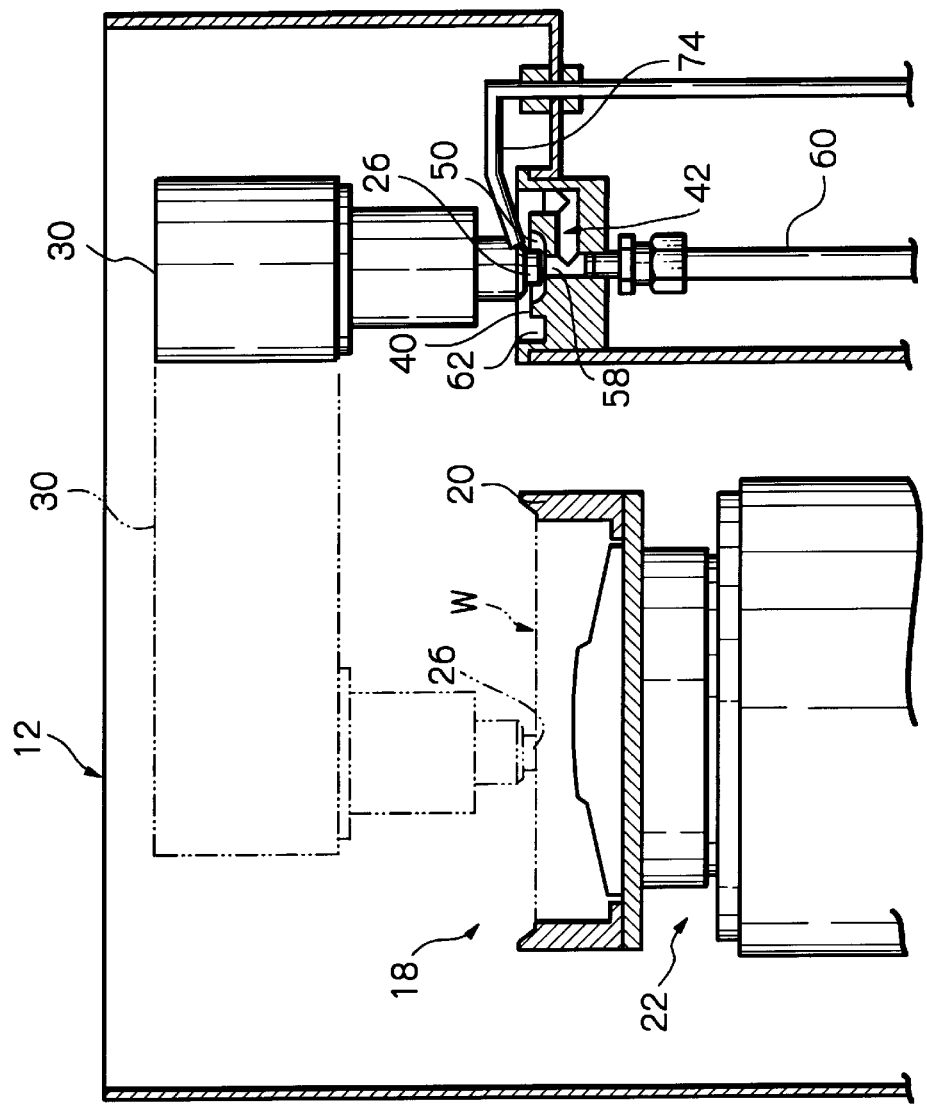
FIG. 2 is a sectional view taken along a line 2—2.

Referring to FIGS. 1 and 2, a wafer cleaning apparatus 10 in accordance with the present invention is shown. The cleaning apparatus 10 includes a wafer cleaning station 12 and a cleaning member rinsing station 14.

The wafer cleaning station 12 includes a wafer rotator 18 having a plurality of wafer clamping members 20 which are provided on a rotational driver 22 and arranged in such a manner that the clamping members are circumferentially spaced around a wafer W to horizontally hold and rotate the wafer, a cleaning liquid supply nozzle (not shown) for supplying cleaning liquid such as water onto the upper surface of the wafer, and a sponge cleaning member 26 adapted to be engaged with the upper surface of the wafer held by the clamping members 20. The cleaning member 26 is provided at a tip end of a pivotable arm 30 which is pivotable about a vertical axis 32. The cleaning member is also adapted to be drivingly rotated about its vertical axis.

In a wafer cleaning operation, the cleaning member 26 is rotated about its axis and engaged with the upper surface of the wafer while the cleaning liquid supply nozzle supplies cleaning liquid onto the upper surface of the wafer which is being rotated by the rotation driver 22 in a direction as shown by an arrow A. Simultaneously, the pivotable arm 30 is repeatedly swung about the axis 32 generally along the direction of a diameter of the wafer, whereby slurry particles remaining on the upper surface are removed.

The cleaning member rinsing station 14 has a rinsing apparatus 38 including a rinsing sink 40 for rinsing the cleaning member 26 with a rinsing liquid supplied therein, a drain 42 for receiving rinsing liquid which has overflowed from the rinsing sink 40 and a cleaning member carrier (in this embodiment, the pivotable arm 30 for moving the cleaning member 26 into the rinsing sink 40). The pivotable arm is adapted to rotate about its pivotable axis 32 from the cleaning operation position as shown by a solid line in FIG. 1 to a rinsing operation position as shown by a phantom line in FIG. 1. In the rinsing operation position, the cleaning member 26 is positioned above the rinsing sink 40 and the pivotable arm is adapted to vertically to move the cleaning member 26 between a rinsing position as shown by a rigid line in FIG. 3 (where the cleaning member is positioned in the rinsing sink) and a retracted position as shown by a phantom line in FIG. 3 where the cleaning member 26 is lifted out of the rinsing sink 40.

Figure 4:
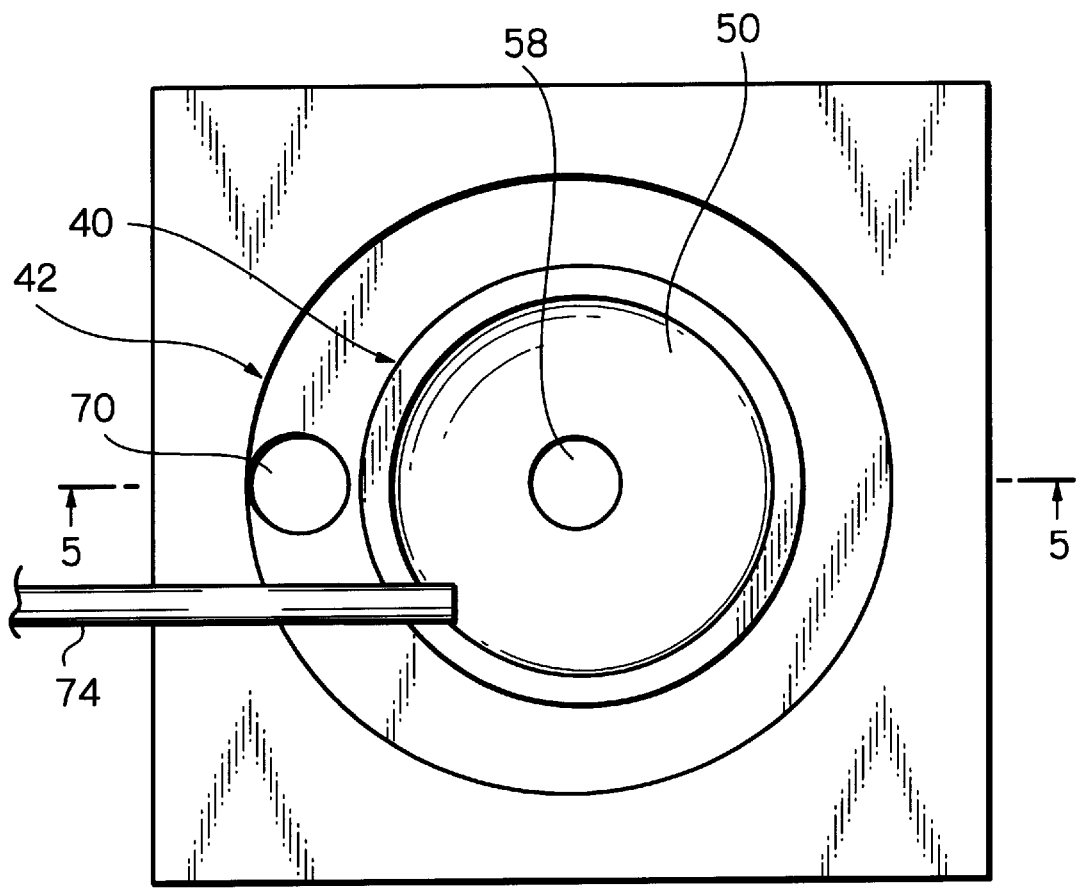
FIG. 4 is a plan view of the rinsing sink.
Figure 5:
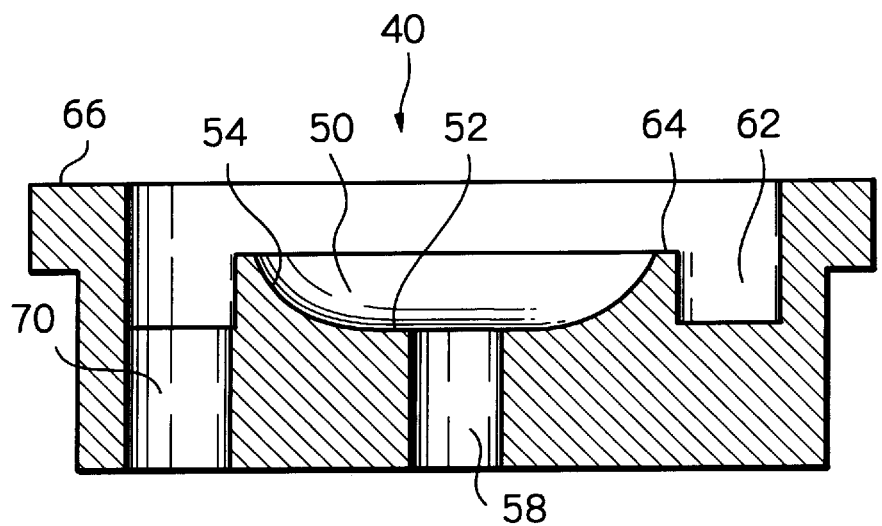
FIG. 5 is a sectional view taken along a line 5—5.

As clearly shown in FIGS. 4 and 5, the rinsing sink 40 has a rounded cup-like cavity 50 having a horizontal bottom surface 52 and a slanted side surface 54 to define the cavity. At the center of the bottom of the cavity there is provided a drain hole 58 extending through the bottom wall of the rinsing sink vertically which hole is connected to a drain pipe 60. The drain 42 of the rinsing apparatus includes an annular groove 62 provided around the rinsing sink 40 which is defined by a first circular side wall 64 of the sink 40 and a second circular side wall 66 which is radially outwardly spaced from and higher than the first circular side wall 64. The groove 62 is provided with a drain hole 70 at the bottom of the groove which is connected to a drain pipe 72.

Figure 6:
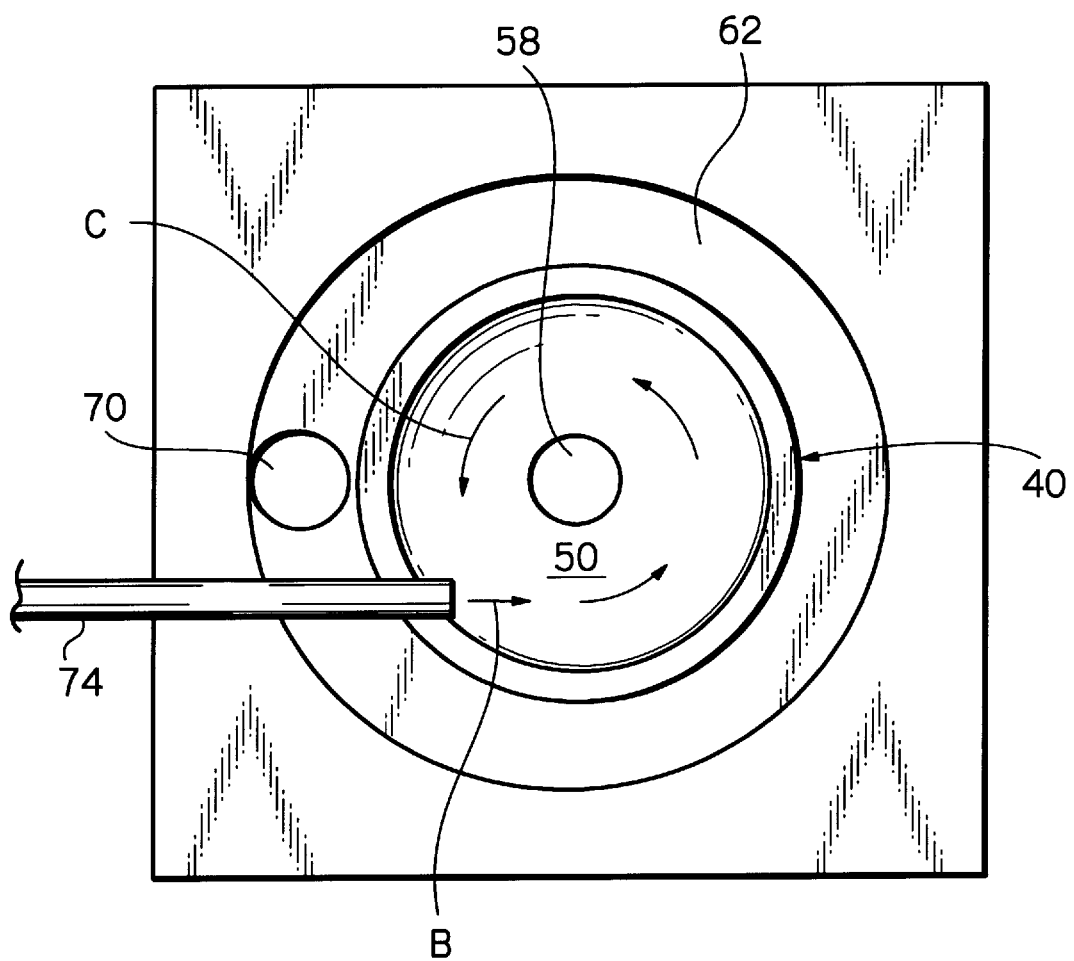
FIG. 6 is a plan view of the rinsing sink and a rinsing liquid supply nozzle of the cleaning apparatus.

The rinsing apparatus further includes a nozzle 74 for supplying a rinsing liquid or water into the rinsing sink in a tangential direction of the rinsing sink as shown by an arrow B in FIG. 6.

Figure 3:
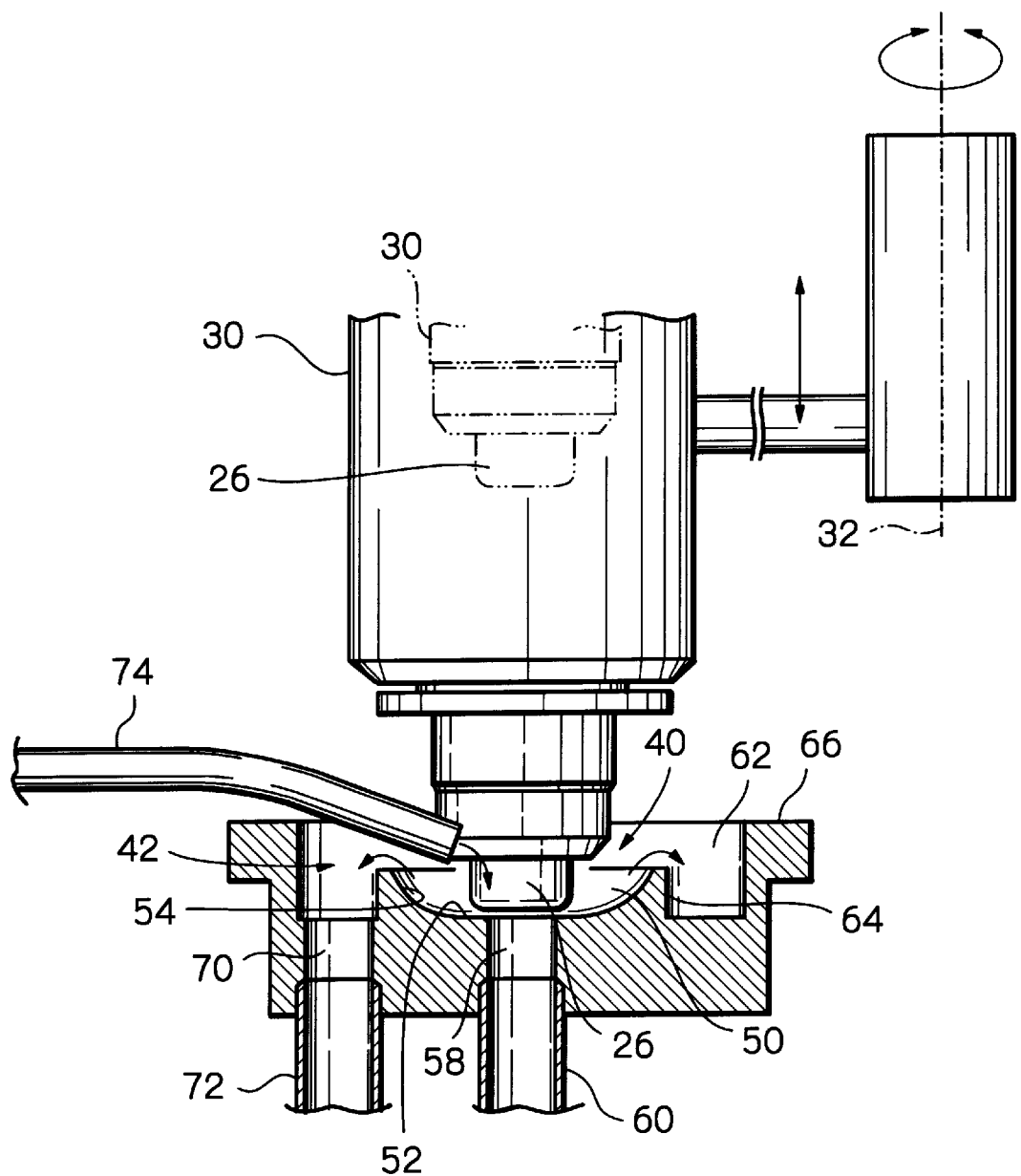
FIG. 3 is an enlarged sectional view of a rinsing sink and a cleaning member carrier of the cleaning apparatus.

In operation, the nozzle 74 continuously supplies a rinsing liquid into the rinsing sink 40 and the carrier 30 is moved to the rinsing position in which the cleaning member 26 is, as shown in FIG. 3, positioned above and close to the inlet of the drain hole provided in the bottom wall of the rinsing sink. Thus, the flow of the rinsing liquid from the sink into the drain hole 58 is restricted. Accordingly the rinsing liquid continuously supplied into the rinsing sink instantly fills the sink and then overflows from the sink into the drain 42 through the circular groove. The cleaning member 26 is drivingly rotated about its axis and rinsed with the rinsing liquid supplied in the sink in a swirling manner as shown by arrows C in FIG. 6. The cleaning member 26 may be adjustably positioned relative to the drain hole 58 in order to adjust an amount of the rinsing liquid overflowing from the rinsing sink 40.

When the rinsing operation of the cleaning member has been finished, the pivotable arm 30 is moved up to the retracted position to lift up the cleaning member from the rinsing sink. Consequently, the restriction to the fluid flow from the rinsing sink into the drain hole 58 caused by the cleaning member is removed and a large amount of the rinsing liquid is able to flow through the drain hole 58 in the manner of a sudden rush of liquid. Thus, slurry particles which have fallen onto the bottom surface of the rinsing sink 40 are washed away through the drain hole 58. In this embodiment, the drain hole is sized in such a manner that, although the supply nozzle 74 supplies a rinsing liquid continuously even after the above noted rinsing operation is finished, all of the rinsing liquid in the rinsing sink 40 is instantly drained through the drain hole 58. Thus, the rinsing liquid continuously supplied by the nozzle 74 swirls around the inner wall surface of the rinsing sink 40 and then flows into the drain hole 58 to thereby keep the inner wall surface clean.

Although the present invention has been explained with reference to the drawings, the entire disclosure of Japanese Patent Application Hei 9-330993 filed on Nov. 13, 1997 including the specification, claims, drawings and summary is incorporated herein by reference to its entirety.

What is claimed is:

1. A rinsing apparatus comprising:
    a rinsing sink having a bottom wall and a side wall defining a cavity for rinsing an article in said cavity with a rinsing liquid supplied into said cavity, said rinsing sink including a sink drain having an inlet in said bottom wall;
    an overflow drain for receiving a portion of the rinsing liquid overflowing from said cavity of said rinsing sink; and
    a carrier for carrying the article to be rinsed, said carrier being operable to move between a rinsing position, whereat the article carried by said carrier is positioned at said inlet of said sink drain so as to restrict a rinsing liquid flow path from said rinsing sink to said sink drain such that the rinsing liquid supplied into said cavity of said rinsing sink fills said cavity and overflows into said overflow drain while a flow of rinsing liquid through said rinsing liquid flow path is maintained, and a retracted position, whereat the article carried by said carrier is positioned out of said rinsing sink so as to allow the rinsing liquid to flow from said rinsing sink into said sink drain without restriction by the article.

2. The apparatus of claim 1, further comprising a nozzle for supplying rinsing liquid into said cavity of said rinsing sink at a flow rate such that, when said carrier is in said rinsing position, the rinsing liquid supplied through said nozzle fills said cavity and overflows into said overflow drain, and said sink drain being formed such that, when said carrier is in said retracted position, all rinsing liquid in said cavity of said rinsing sink can flow out through said sink drain even if said nozzle continues to supply rinsing liquid to said cavity.

3. The apparatus of claim 1, wherein said cavity has a rounded cup-like shape and said inlet of said sink drain is provided at a center of said bottom wall.

4. The apparatus of claim 3, wherein, when said carrier is in said rinsing position, the article is positioned above said inlet of said sink drain.

5. The apparatus of claim 1, further comprising a nozzle for supplying the rinsing liquid into said cavity of said rinsing sink, said nozzle being arranged so as to supply the rinsing liquid in a tangential direction with respect to said cavity of said rinsing sink so as to create a swirling flow of rinsing liquid in said cavity.

6. A cleaning apparatus comprising:

a cleaning station including a cleaning member adapted so as to engage and move relative to an object to be cleaned;

a cleaning member rinsing station including a rinsing sink having a bottom wall and a side wall defining a cavity for rinsing said cleaning member in said cavity with a rinsing liquid supplied into said cavity, said rinsing sink including a sink drain having an inlet in said bottom wall;

a cleaning member carrier for carrying said cleaning member between a first position, whereat said cleaning member is engaged with a surface of the object to be cleaned so as to clean the object, and a second position, whereat said cleaning member is positioned in said rinsing sink so as to rinse said cleaning member, and said cleaning member carrier being operable to move between a rinsing position, whereat said cleaning member is positioned at said inlet of said sink drain so as to restrict a rinsing liquid flow path from said rinsing sink to said sink drain such that the rinsing liquid supplied into said cavity of said rinsing sink fills said cavity and overflows from said cavity while a flow of rinsing liquid through said rinsing liquid flow path is maintained, and a retracted position, whereat said cleaning member is positioned out of said rinsing sink so as to allow the rinsing liquid to flow from said rinsing sink into said sink drain without restriction by said cleaning member.

7. The apparatus of claim 6, further comprising a nozzle for supplying the rinsing liquid into said cavity of said rinsing sink at a flow rate such that, when said carrier is in said rinsing position, the rinsing liquid supplied through said nozzle fills said cavity and overflows, and said sink drain being formed such that, when said carrier is in said retracted position, all rinsing liquid in said cavity of said rinsing sink can flow out through said sink drain even if said nozzle continues to supply rinsing liquid to said cavity.

8. The apparatus of claim 6, wherein said cavity has a rounded cup-like shape and said inlet of said sink drain is provided at a center of said bottom wall.

9. The apparatus of claim 8, wherein, when said carrier is in said rinsing position, said cleaning member is positioned above said inlet of said sink drain.

10. The apparatus of claim 6, further comprising a nozzle for supplying the rinsing liquid into said cavity of said rinsing sink, said nozzle being arranged so as to supply the rinsing liquid in a tangential direction with respect to said cavity of said rinsing sink so as to create a swirling flow of rinsing liquid in said cavity.

* * * * *